(12) United States Patent
Chang et al.

(10) Patent No.: US 6,486,028 B1
(45) Date of Patent: Nov. 26, 2002

(54) METHOD OF FABRICATING A NITRIDE READ-ONLY-MEMORY CELL VERTICAL STRUCTURE

(75) Inventors: Kent Kuohua Chang, Taipei (TW); Yao-Wen Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,459

(22) Filed: Nov. 20, 2001

(51) Int. Cl.⁷ .............................................. H01L 21/336
(52) U.S. Cl. ....................................... 438/259; 257/302
(58) Field of Search ................................. 438/259, 589; 257/316

(56) References Cited

U.S. PATENT DOCUMENTS

| | | | | |
|---|---|---|---|---|
| 5,146,426 A | * | 9/1992 | Mukherjee et al. | 365/149 |
| 5,460,989 A | * | 10/1995 | Wake | 438/259 |
| 5,468,663 A | * | 11/1995 | Bertin | 438/259 |
| 5,739,567 A | * | 4/1998 | Wong | 257/316 |
| 6,232,626 B1 | * | 5/2001 | Rhodes | 257/292 |

* cited by examiner

Primary Examiner—Hoai Ho
Assistant Examiner—Thao P. Le
(74) Attorney, Agent, or Firm—J.C. Patents

(57) ABSTRACT

A method for fabricating a nitride read only device is disclosed. A trench is formed in a semiconductor substrate. An ion implantation is performed to form a first source/drain region and a second source/drain region within the substrate in the upper corners of the trench, and to form a common source/drain region within the substrate at a bottom of the trench. Next, a trapping layer is formed over the substrate and the trench and a gate conducting layer is formed over the substrate and filling the trench.

20 Claims, 3 Drawing Sheets

METHOD OF FABRICATING A NITRIDE READ-ONLY-MEMORY CELL VERTICAL STRUCTURE

BACKGROUND OF THE INVENTION

1. Field of Invention

The present invention relates generally to a semiconductor device. More particularly to a nitride read only memory (NROM) cell structure.

2. Description of Related Art

Nitride Read-Only-Memory (NROM) device is well known to be n-channel MOSFET memory device comprising a capturing or trapping dielectric material, for example a silicon nitride layer sandwiched between two silicon oxide layers (ONO). The charge is stored in the nitride layer located over the channel region, providing charge retention mechanism for programming the memory cell, while the silicon oxide layers which sandwiches the nitride layer is to avoid any tunneling of this charge. When programming voltages are provided to the source, the drain and the gate, electrons flows towards the drain as a result, some hot electrons penetrate through the lower section of silicon oxide, and are then collected and concentrated in the nitride layer. The concentrated charge in the nitride layer will significantly raise the threshold voltage of the portion of the channel region to a level higher than the threshold voltage of the remaining portion of the channel. When concentrated charge is present the memory cell is said to be programmed, and under this condition, the raised threshold voltage of the memory cell does not permit the memory cell to be in a conductive state during reading. On the other hand, if concentrated charge is not present in the nitride layer, then read voltage on gate can overcome the much lower threshold and accordingly, channel becomes inverted and hence, conductive.

The use of NROM is preferred over the conventional read only memory (ROM), programmable ROM (PROM), erasable programmable ROM (EPROM). electrically erasable programmable ROM (EEPROM) and flash EEPROM because NROM is programmable by using channel hot electron injection to trap charge in the nitride layer sandwiched between two silicon oxide layers through the channel region, thereby reducing the programming time compared to the programming time required in the conventional PROM devices. Further, in a conventional device (for example, PROM) the time required to erase a program is much greater than the programming time, thus the total time required for the erasing and programming is greatly increased.

It is well known design rule that in order to achieve faster, smaller, and more densely packed integrated circuit device in semiconductor device manufacturing, the transistor size including the gate length and the channel length should be reduced. However, a stage is reached where the gate length and the channel length cannot be reduced beyond a critical value which would otherwise increase the parasitic source/drain junction capacitance of the device, resulting in adverse effects what is commonly known as short channel effects such as, hot carrier damage, and the possibility of punch-through between the source/drain regions, which would have an adverse effect on the device performance. Therefore, the size reduction of the transistors for further integration of the semiconductor device is limited due to the short channel length.

One way to improve integrated circuit device performance is to reduce the junction capacitance of transistor. To reduce junction capacitance, the channel length has to be large enough to avoid short channel effects. But a large channel length would limit the size reduction of the transistor beyond the critical value, as described above, thereby limiting the integration of the semiconductor device.

Accordingly, it is highly desirable to provide a method of fabricating a MOSFET structure having reduced size and while maintaining good device characteristics.

SUMMARY OF THE INVENTION

Accordingly, it is an object of the present invention is to provide a method for fabricating a NROM structure where the size reduction is not limited to the channel length.

Another object of the present invention is to provide a method for fabricating a NROM structure, wherein the channel is disposed along vertical direction. Therefore, in this scheme channel length would not limit the reduction of the device size.

Yet another object of the present invention is to provide a method for fabricating a NROM structure having a reduced junction capacitance so that the performance of the NROM device is improved.

Yet another object of the present invention is to provide a method for fabricating a NROM structure having a desired channel length so that the junction capacitance of the device can be effectively adjusted so that a device with a desired performance can be achievable.

In accord with above objects and other advantages, the present invention provides a method for fabricating a vertical nitride read-only-memory unit, comprising, providing a substrate, forming a trench in the substrate, performing an ion implantation into the substrate to form a first source/drain region and a second source/drain region within the substrate in the upper corners of the trench, and to form a common source/drain region in the substrate at a bottom of the trench. Next, forming a trapping layer over the substrate and the trench and forming a gate conducting layer over the substrate and filling the trench.

An aspect of the present invention is that because the NROM device of the present invention is a vertical device, therefore, the area occupied by the vertical NROM device is substantially smaller compared to the conventional NROM device, which is a horizontal structure. Therefore higher integration of memory device can be realized.

Another aspect of the present invention is that because the NROM device of the present invention is a vertical structure, therefore, the channel is also disposed in a vertical direction. Therefore the bit lines can be disposed along the X direction. This allows size reduction of the NROM cell.

Yet another aspect of the present invention is that because the NROM device of the present invention is a vertical structure, therefore, the channel is also disposed in a vertical direction. Therefore the channel length can be adjusted by adjusting the depth of the trench, thus a channel length of desired length can be effectively formed for a desired (reduced) junction capacitance. Therefore the undesired effects due to short channel effects such as hot carrier damage or punch-through effects can be effectively avoided thereby, good device characteristics can be maintained.

Yet another aspect of the present invention is that because the reduced junction capacitance the RC delay time can be effectively decreased. Therefore the operation speed of the device is effectively increased, thereby the device performance can be substantially improved.

It is understood that the foregoing general description and the following detailed description are exemplary, but are not restrictive, of the invention.

BRIEF DESCRIPTION OF THE DRAWING

The present invention is best understood from the following detailed description when read in connection with the accompanying drawing. Included in the drawing are the following figures.

DESCRIPTION OF THE PREFERRED EMBODIMENTS

Figure 1:
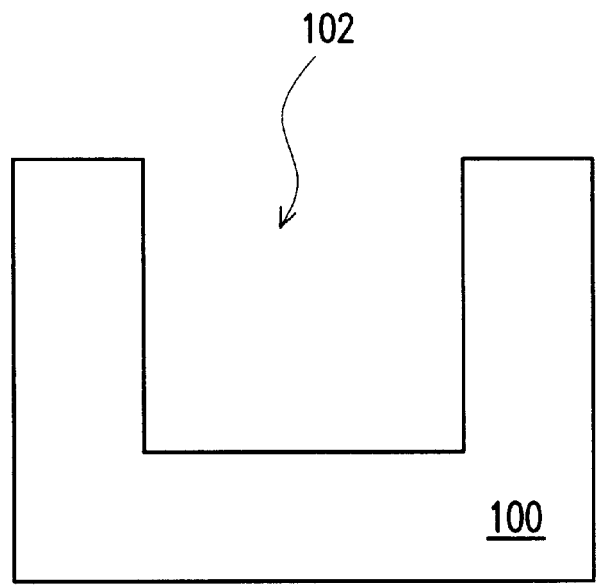
FIGS. 1 through 6 is a schematic, showing the progression of manufacturing process for forming a NROM unit according to a preferred embodiment of the present invention.

Reference will be made in detail to the present preferred embodiments of the invention, examples of which are illustrated in the accompanying drawings. Wherever possible, the same reference numbers are used in the drawings and the description to refer to the same or like parts.

Referring to FIG. 1, a semiconductor substrate 100 is provided. A trench 102 is formed in the semiconductor substrate 100 by for example, conventional photolithography and etching process. Preferably, the etching process is substantially anisotropic in nature using a suitable plasmas gas mixture. It is preferable that the width of the trench is about 0.2–0.6 μm and the depth of the trench is about 0.3–0.8 μm. An additional treatment using a dilute $H_2O_2$ solution is carried out to remove any unwanted native oxides from the surface of the substrate 100 that may be formed during the former anisotropic etching process. Alternatively, the etching process may be a wet etching process using a suitable wet etchant solvents. A channel threshold adjust implantation (not shown) is then performed using a typical tilt angle implantation technique using, for example, boron or boron fluoride ions for NMOS devices or, for example, arsenic or phosphorus ions for PMOS devices to a dose of between about $3 \times 10^{11}$ ions/cm$^2$ to about $5 \times 10^{13}$ ions/cm$^2$ at an energy of between about 5 to 50 KeV.

Figure 2:
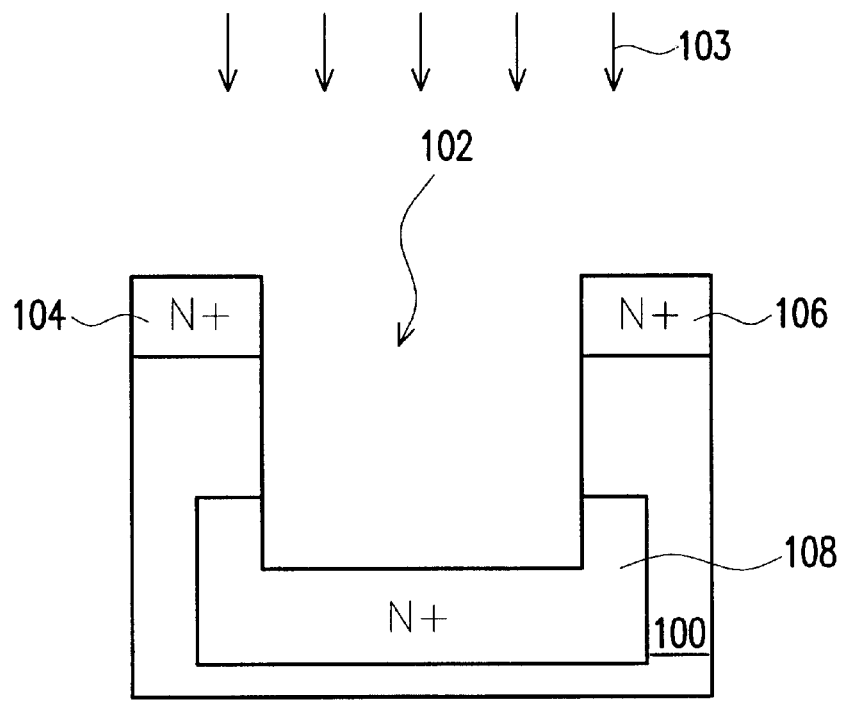

Referring to FIG. 2, an ion implantation 103 is performed to form a first source/drain region 104, and a second source/drain region 106 within the substrate 100 in the upper corners of the trench 102, and to form a common source/drain region 108 within the substrate 100 at a bottom of the trench 102. Typically, the source/drain regions 104, 106 and 108 implantations are made preferably in the well known manner using implantations of boron fluoride, arsenic or phosphorus ions with a dose of between about $3 \times 10^{15}$ ions/cm$^2$ at an energy level of between about 60 KeV. Preferably, arsenic ions are used. The source/drain regions 104, 106 and 108 are then activated by heating the device to a temperature of between about 800° C. to 1100° C. for between 10 seconds (RTA, higher temperature) and 60 minutes (lower temperature).

Figure 3:
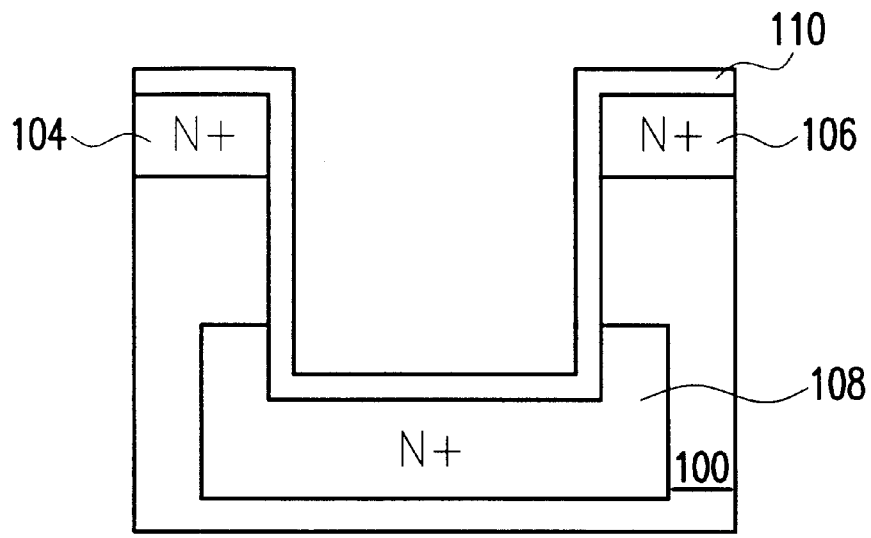
Figure 4:
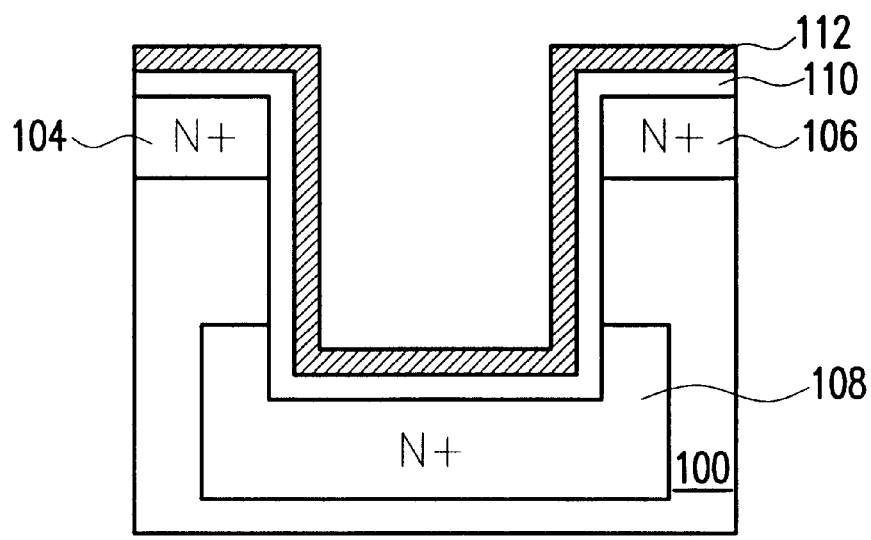
Figure 5:
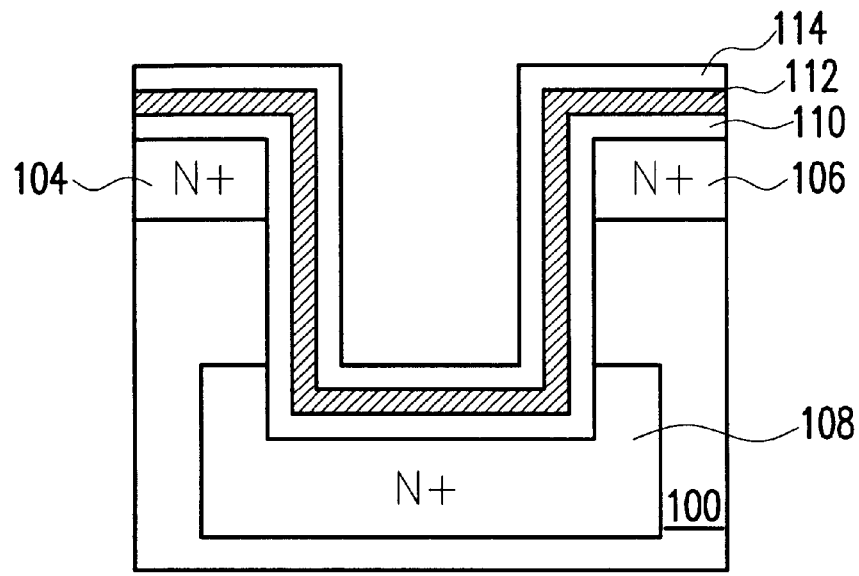

Referring to FIG. 3–5, a trapping layer is formed over the substrate 100 and the trench 102. Preferably, the trapping layer comprises a silicon nitride layer 112 sandwiched between two silicon oxide layers 110 and 114. Referring to FIG. 3, a bottom silicon oxide layer 110 is grown over substrate 100 and the trench 102 typically at a temperature of about 1050° C. in dry oxygen ambient. Typically, a thickness between about 50 angstroms to about 70 angstroms using a thermal oxidation operation. A typical oxidation temperature is about 900° C. in presence of NO, $N_2O$ or $NH_3$, or mixture of these gases.

Next, referring to FIG. 4, a silicon nitride layer 112 is then deposited over the bottom silicon dioxide oxide layer 110 to a thickness of between about 110 angstroms and about 135 angstroms. Preferably, the silicon nitride layer 112 is formed by using a low pressure chemical vapor deposition method (LPCVD) at a temperature of about 760° C. and a pressure of about 330 mTorr. Alternatively the silicon nitride layer 112 may also be formed by using a rapid thermal chemical vapor deposition (RTCVD).

Next, referring to FIG. 5, a top silicon oxide 114 is then formed over the silicon nitride layer 112, either through a rapid thermal oxidation of the silicon nitride layer 112 in a steam ambient or by deposition or by a combination thereof. It is to be noted that the top silicon oxide layer 114 consumes some of the silicon nitride layer 112 during oxidation, where typically half of the silicon oxide layer 114 thickness produced from the consumed silicon nitride layer 112. Thus, if it is desired to have a top silicon oxide layer 114 to be about 140–160 angstroms thick, then silicon nitride layer 112 should be at least 70–80 angstroms thicker than the final desired silicon nitride thickness. However, the thickness of the top silicon oxide layer 114 can be tailored by adjusting the thickness of the silicon nitride layer 112. Alternatively, the top silicon oxide layer 114 may also be formed using a HTO or a RTCVD deposition process.

Figure 6:
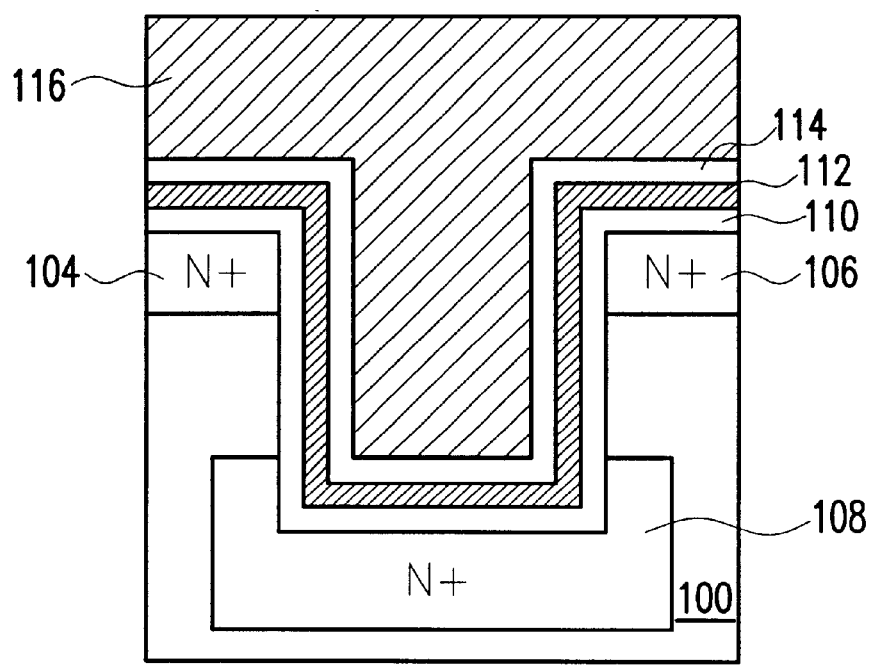

Referring to FIG. 6, a gate conducting layer 116 is formed over the substrate 100 and filling the trench 102. The gate conducting layer 116 includes a doped polysilicon layer. Preferably, the thickness of the gate conducting layer is about 1000 to 3000 angstroms. The gate conducting layer 116 may be formed for example, by depositing an amorphous layer of undoped polysilicon using a low pressure chemical vapor deposition method over the substrate, at a temperature of about 530° C. and a pressure of about 200 mTorr, implanting an activating impurities, for example, $SiH_3$ or $PH_3$ into the polysilicon to render it conductive.

It is to be understood by those skilled in the art that because the NROM transistor of the present invention is a vertical structure, therefore, the area occupied by the vertical NROM cell is substantially smaller compared to the convention transistor which is a horizontal structure. As it is a well known design rule that a smaller area occupation of devices would lead to further densification of devices resulting a highly device. Therefore higher integration of memory device can be realized.

It is to be understood by those skilled in the art that because the NROM present invention is a vertical structure, therefore, the channels are also vertical direction. Therefore the bit lines can be formed along the X allows further size reduction of the NROM cell.

It is to be understood by those skilled in the art that because the NROM transistor of the present invention is a vertical structure, therefore, the channels are also disposed in a vertical direction. Therefore the channel length can be adjusted by adjusting the depth of the trench 102, thus a desired channel length can be effectively formed for desired (reduced) junction capacitance. Therefore the undesired effects due to short channel effects such as hot carriers effects or punch-through effects can be effectively avoided thereby, good device characteristics can be maintained.

It is to be further understood by those skilled in the art that because the reduced junction capacitance the RC delay time can be effectively decreased. Therefore the operation speed of the device is effectively increased, thereby the device performance can be substantially improved.

While the best mode reference to a NROM transistor, it should be understood that the present invention is not limited to NROM transistor but other MOSFET transistors may also be manufactured following the method of the present invention and to practice the present invention.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for fabricating a vertical nitride read-only-memory unit, comprising the steps of:

providing a substrate;

forming a trench in the substrate;

performing an ion implantation into the substrate to form a first source/drain region and a second source/drain region within the substrate in the upper corners of the trench, and to form a third source/drain region in the substrate at a bottom of the trench;

forming a trapping layer over the substrate and the trench, wherein the trapping layer comprises an oxide-nitride-oxide (ONO) layer; and forming a gate conducting layer over the substrate and filling the trench.

2. The method according to claim 1, wherein the ONO layer includes a silicon nitride layer sandwiched between a bottom silicon oxide layer and a top silicon oxide layer.

3. The method according to claim 2, wherein the bottom silicon oxide layer are formed by using a thermal oxidation.

4. The method according to claim 2, wherein the thickness of the bottom silicon oxide layer is about 50 angstroms to 70 angstroms.

5. The method according to claim 2, wherein the silicon nitride layer is formed by using a low pressure chemical vapor deposition.

6. The method according to claim 2, wherein the thickness of the silicon nitride layer is about 110 angstroms to 135 angstroms.

7. The method according to claim 2, wherein the top silicon oxide layer is formed by using a rapid thermal oxidation process.

8. The method according to claim 2, wherein the thickness of the top silicon oxide layer is about 140 angstrom to about 160 angstroms.

9. The method according to claim 1, wherein the material of the gate conducting layer includes a doped polysilicon.

10. The method according to claim 9, wherein the doped polysilicon layer is formed using a low pressure chemical vapor deposition method.

11. A method for fabricating a vertical nitride read-only-memory unit over a substrate comprising a trench, a first source/drain region and a second source/drain region within the substrate in the upper corners of the trench, and a third source/drain region in the substrate at a bottom of the trench, the method comprising the steps of:

forming a trapping layer over the substrate and the trench, wherein the trapping layer comprises an oxide-nitride-oxide (ONO) layer; and forming a gate conducting layer over the substrate and filling the trench.

12. The method according to claim 11, wherein the ONO layer includes a silicon nitride layer sandwiched between a bottom silicon oxide layer and a top silicon oxide layer.

13. The method according to claim 12, wherein the bottom silicon oxide layer are formed by using a thermal oxidation.

14. The method according to claim 12, wherein the thickness of the bottom silicon oxide layer is about 50 angstroms to 70 angstroms.

15. The method according to claim 12, wherein the silicon nitride layer is formed by using a low pressure chemical vapor deposition.

16. The method according to claim 12, wherein the thickness of the silicon nitride layer is about 110 angstroms to 135 angstroms.

17. The method according to claim 12, wherein the top silicon oxide layer is formed by using a rapid thermal oxidation process.

18. The method according to claim 12, wherein the thickness of the top silicon oxide layer is about 140 angstrom to about 160 angstroms.

19. The method according to claim 11, wherein the material of the gate conducting layer includes a doped polysilicon.

20. The method according to claim 19, wherein the doped polysilicon layer is formed using a low pressure chemical vapor deposition method.

* * * * *